United States Patent
Lee et al.

(10) Patent No.: US 12,144,224 B2
(45) Date of Patent: Nov. 12, 2024

(54) DISPLAY DEVICE WHICH PREVENTS COLOR MIXING BETWEEN ADJACENT PIXELS

(71) Applicant: Samsung Display Co., Ltd., Yongin-Si (KR)

(72) Inventors: Seon Uk Lee, Seongnam-si (KR); Kang Uk Kim, Hwaseong-si (KR); Yeo Geon Yoon, Seoul (KR); Don Chan Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 573 days.

(21) Appl. No.: 17/370,046

(22) Filed: Jul. 8, 2021

(65) Prior Publication Data

US 2022/0109027 A1    Apr. 7, 2022

(30) Foreign Application Priority Data

Oct. 6, 2020    (KR) .......................... 10-2020-0128765

(51) Int. Cl.
*H10K 59/38*    (2023.01)
*H10K 59/12*    (2023.01)
(Continued)

(52) U.S. Cl.
CPC ........... *H10K 59/38* (2023.02); *H10K 59/352* (2023.02); *H10K 59/353* (2023.02);
(Continued)

(58) Field of Classification Search
CPC .......... H10K 59/12; H10K 59/352–353; H10K 59/38
See application file for complete search history.

(56) References Cited

U.S. PATENT DOCUMENTS

2013/0334507 A1*  12/2013  Shimoji ................. H10K 71/00
                                                                          257/40
2018/0097038 A1   4/2018  Lee et al.
(Continued)

FOREIGN PATENT DOCUMENTS

EP    3301552 A1    4/2018
EP    3588567 A1    1/2020
(Continued)

*Primary Examiner* — Steven M Christopher
*Assistant Examiner* — Tyler J Wiegand
(74) *Attorney, Agent, or Firm* — Innovation Counsel LLP

(57) ABSTRACT

An embodiment provides a display device including: a first pixel, a second pixel, and a third pixel that form one dot and display different colors; a first light emitting element disposed in the first pixel, a second light emitting element disposed in the second pixel, and a third light emitting element disposed in the third pixel; and a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed, wherein the first color conversion area, the second color conversion area, and the third color conversion area have polygonal planar shapes having at least 5 sides.

18 Claims, 16 Drawing Sheets

(51) Int. Cl.
  *H10K 59/35* (2023.01)
  *G09G 3/20* (2006.01)
  *G09G 3/32* (2016.01)

(52) U.S. Cl.
  CPC ............ *G09G 3/2003* (2013.01); *G09G 3/32* (2013.01); *G09G 2300/0426* (2013.01); *G09G 2300/0452* (2013.01); *H10K 59/12* (2023.02)

(56) References Cited

U.S. PATENT DOCUMENTS

| | | | |
|---|---|---|---|
| 2018/0203292 A1* | 7/2018 | Kim | ................ G02F 1/133617 |
| 2019/0179065 A1* | 6/2019 | Kim | ........................ G02B 5/201 |
| 2019/0280061 A1 | 9/2019 | Joo et al. | |
| 2019/0346972 A1 | 11/2019 | Wang | |
| 2020/0006443 A1 | 1/2020 | Park et al. | |
| 2020/0035941 A1 | 1/2020 | Yoo et al. | |
| 2020/0119237 A1 | 4/2020 | Kim et al. | |
| 2020/0219935 A1 | 7/2020 | Ahn et al. | |
| 2021/0151518 A1 | 5/2021 | Park et al. | |

FOREIGN PATENT DOCUMENTS

| | | |
|---|---|---|
| EP | 3605614 A1 | 2/2020 |
| EP | 3637471 A1 | 4/2020 |
| KR | 10-2006-0124330 A | 12/2006 |
| KR | 10-2007-0049172 A | 5/2007 |
| KR | 10-2016-0017373 A | 2/2016 |
| KR | 10-2016-0030444 A | 3/2016 |
| KR | 10-1833946 B1 | 3/2018 |
| KR | 10-2018-0061853 A | 6/2018 |
| KR | 10-2030799 B1 | 10/2019 |

* cited by examiner (a)           (b)

(a)  (b)

DISPLAY DEVICE WHICH PREVENTS COLOR MIXING BETWEEN ADJACENT PIXELS

CROSS-REFERENCE TO RELATED APPLICATION

This application claims priority to and the benefit of Korean Patent Application No. 10-2020-0128765 filed in the Korean Intellectual Property Office on Oct. 6, 2020, the entire contents of which are incorporated herein by reference.

BACKGROUND

(a) Field

The present disclosure relates to a display device.

(b) Description of the Related Art

Recently, a light emitting diode display as a self-light emitting display device has attracted attention as a device for displaying an image.

In order to reduce light loss of such a light emitting diode display and display highly efficiency colors on the light emitting diode display, a color conversion panel, and a display device including the same have been proposed.

When adjacent color conversion layers in such a display device including a color conversion layer are mixed, efficiency of the color conversion layer decreases and color mixing may occur between adjacent pixels.

The above information disclosed in this Background section is only for enhancement of understanding of the background of the inventive concept, and therefore it may contain information that does not form the prior art that is already known in this country to a person of ordinary skill in the art.

SUMMARY

Embodiments are to provide a pixel that may be disposed to prevent color conversion layers of a display device from being mixed and to prevent color mixing between adjacent pixels.

It is obvious that the object of the present inventive concept is not limited to the above-described object and may be variously extended without departing from the spirit and scope of the present inventive concept.

An embodiment provides a display device including: a first pixel, a second pixel, and a third pixel that form one dot and display different colors; a first light emitting element disposed in the first pixel, a second light emitting element disposed in the second pixel, and a third light emitting element disposed in the third pixel; and a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed, wherein the first color conversion area, the second color conversion area, and the third color conversion area form polygonal planar shapes having at least 5 sides.

A horizontal length of a planar area of the dot may be larger than a sum of a first horizontal width of the first color conversion area of the first pixel and a second horizontal width of the second color conversion area of the second pixel, a vertical length of a planar area of the dot may be smaller than a sum of a first vertical width of the first color conversion area of the first pixel and a third vertical width of a third color conversion area of the third pixel, and a vertical length of a planar area of the dot may be smaller than a sum of a second vertical width of the second color conversion area of the second pixel and a third vertical width of a third color conversion area of the third pixel.

The polygonal planar shape may have eight sides.

The first pixel and the second pixel may be disposed in a first row and disposed adjacent to each other along a horizontal direction, the third pixel and the first pixel may be alternately disposed along a vertical direction, the third pixel and the second pixel may be alternately disposed along the vertical direction, and an imaginary line connecting a center of the first pixel, a center of the second pixel, and a center of the third pixel may form a triangular planar shape.

The light emitting layer may emit light of a first wavelength, the first color conversion layer may convert the light of the first wavelength to light of a second wavelength, the second color conversion layer may convert the light of the first wavelength to light of a third wavelength, and the third color conversion layer may transmit the light of the first wavelength.

The first color conversion layer may include a first quantum dot and a scatterer, the second color conversion layer may include first quantum dots and scatterers, the second color conversion layer includes second quantum dots and the scatterers, and the third color conversion layer includes the scatterers.

The display device may further include a first substrate and a second substrate facing each other, wherein: the first light emitting element, the second light emitting element, and the third light emitting element may be disposed between the first substrate and the second substrate; the first color conversion layer, the second color conversion layer, and the third color conversion layer may be disposed between the second substrate and the first light emitting element, the second light emitting element, and the third light emitting element, respectively; and the first color conversion area, the second color conversion area, and the third color conversion area may be defined by partition walls.

The display device may further include a cover layer disposed on a side surface of the partition wall and on a lower surface of the partition wall facing the first substrate, and a spacer protruding from a portion of the cover layer toward the first substrate.

The dot may further include a fourth pixel; the fourth pixel and the first pixel may be alternately disposed along the vertical direction; and the fourth pixel and the second pixel may be alternately disposed along the vertical direction.

The display device may further include a first color filter area in which the first light emitting element and a first color filter overlapping the first color conversion layer are disposed, a second color filter area in which the second light emitting element and a second color filter overlapping the second color conversion layer are disposed, and a third color filter area in which the third light emitting element and a third color filter overlapping the third color conversion layer are disposed.

A planar area of the first color filter area may be wider than that of a first light emitting area of the first light emitting element, and a planar area of the first color conversion area may be wider than that of the first color filter area.

A planar area of the second color filter area may be wider than that of a second light emitting area of the second light emitting element, and a planar area of the second color conversion area may be wider than that of the second color filter area.

A planar area of the third color filter area may be wider than that of a third light emitting area of the third light emitting element, and a planar area of the third color conversion area may be wider than that of the third color filter area.

Another embodiment provides a display device including: a first pixel, a second pixel, and a third pixel that form one dot and display different colors; a first light emitting element disposed in the first pixel, a second light emitting element disposed in the second pixel, and a third light emitting element disposed in the third pixel; and a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed, wherein a horizontal length of a planar area of the dot is larger than a sum of a first horizontal width of the first color conversion area of the first pixel and a second horizontal width of the second color conversion area of the second pixel, a vertical length of a planar area of the dot is smaller than a sum of a first vertical width of the first color conversion area of the first pixel and a third vertical width of a third color conversion area of the third pixel, and a vertical length of a planar area of the dot is smaller than a sum of a second vertical width of the second color conversion area of the second pixel and a third vertical width of a third color conversion area of the third pixel.

The first color conversion area, the second color conversion area, and the third color conversion area may have polygonal planar shapes, and the polygonal planar shape having at least five sides.

Another embodiment provides a display device including: a first pixel, a second pixel, and a third pixel that form one dot and display different colors; a first light emitting element disposed in the first pixel, a second light emitting element disposed in the second pixel, and a third light emitting element disposed in the third pixel; and a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed, wherein the first color conversion area, the second color conversion area, and the third color conversion area form polygonal planar shapes with an aspect ratio of greater than 1; a horizontal length of a planar area of the dot is smaller than a sum of a first horizontal width of the first color conversion area of the first pixel and a third horizontal width of the third color conversion area of the third pixel; a horizontal length of a planar area of the dot is smaller than a sum of a second width of the second color conversion area of the second pixel and a third horizontal width of the third color conversion area of the third pixel; a vertical length of a planar area of the dot is larger than a sum of a first vertical width of the first color conversion area of the first pixel and a second vertical width of the second color conversion area of the second pixel; the first pixel and the second pixel are disposed in a line to be adjacent to each other along a vertical direction, and the third pixel and the first pixel are alternately disposed along a horizontal direction; the third pixel and the second pixel are alternately disposed along the horizontal direction; and an imaginary line connecting a center of the first pixel, a center of the second pixel, and a center of the third pixel forms a triangular planar shape.

According to the display device of the embodiments, mixing between color conversion layers and color mixing between adjacent pixels may be prevented.

It is obvious that the effect of the present inventive concept is not limited to the above-described effect and may be variously extended without departing from the spirit and scope of the present inventive concept.

DETAILED DESCRIPTION OF THE EMBODIMENTS

Figure 1:
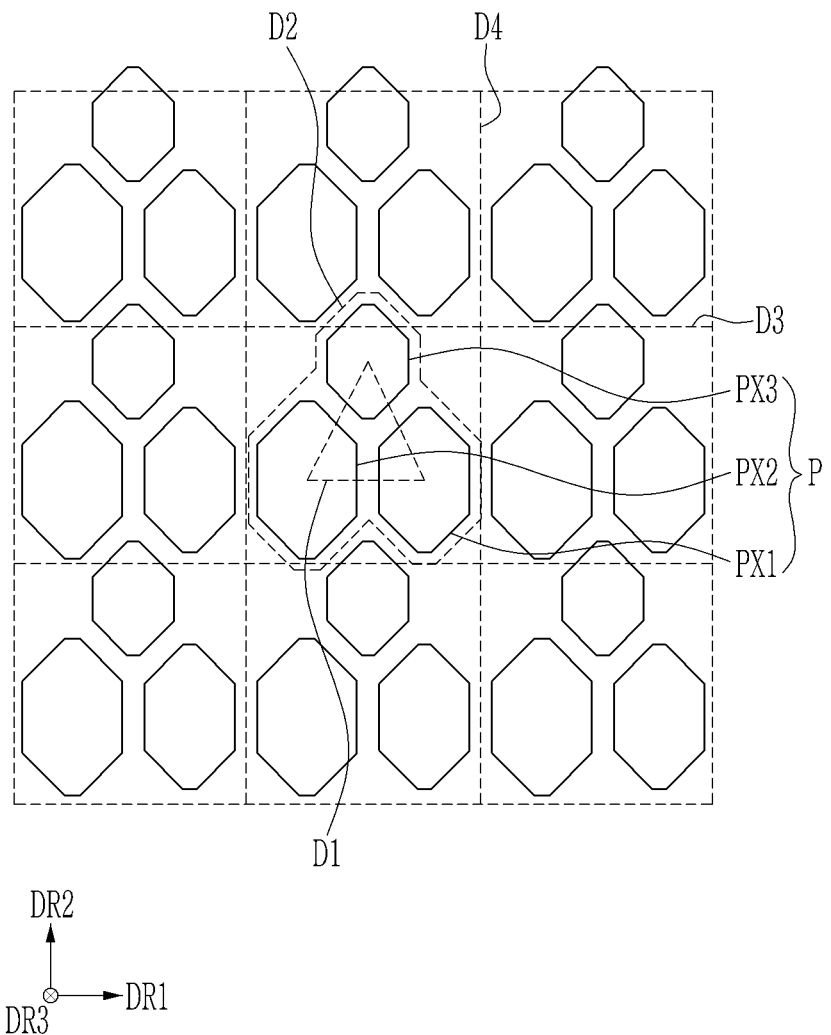
FIG. 1 illustrates a layout view of a plurality of pixels of a display device according to an embodiment.

The present inventive concept will be described more fully hereinafter with reference to the accompanying drawings, in which embodiments of the inventive concept are shown. As those skilled in the art would realize, the described embodiment may be modified in various different ways, all without departing from the spirit or scope of the present.

In order to clearly describe the present inventive concept, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area or substrate is referred to as being "on"

another element, it can be directly on the other element or intervening elements may also be present. In contrast, when an element is referred to as being "directly on" another element, there are no intervening elements present. Further, in the specification, the word "on" or "above" means positioned on or below the object portion and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function and may also be referred to as a case in which respective parts that are substantially integrated are linked to each other.

Throughout the specification, "in a plan view" means to view a plane parallel to two directions crossing each other (for example, a first direction DR1 and a second direction DR2), and "in a cross-sectional view" means to view a plane cut in a direction (for example, a third direction DR3) perpendicular to a plane parallel to the first direction DR1 and the second direction DR2.

In addition, to overlap two elements means that two elements are overlapped in the third direction DR3 (for example, a direction perpendicular to an upper surface of the substrate) unless stated otherwise.

Hereinafter, a display device according to an embodiment of the present inventive concept will be described in detail with reference to the accompanying drawings.

Figure 2:
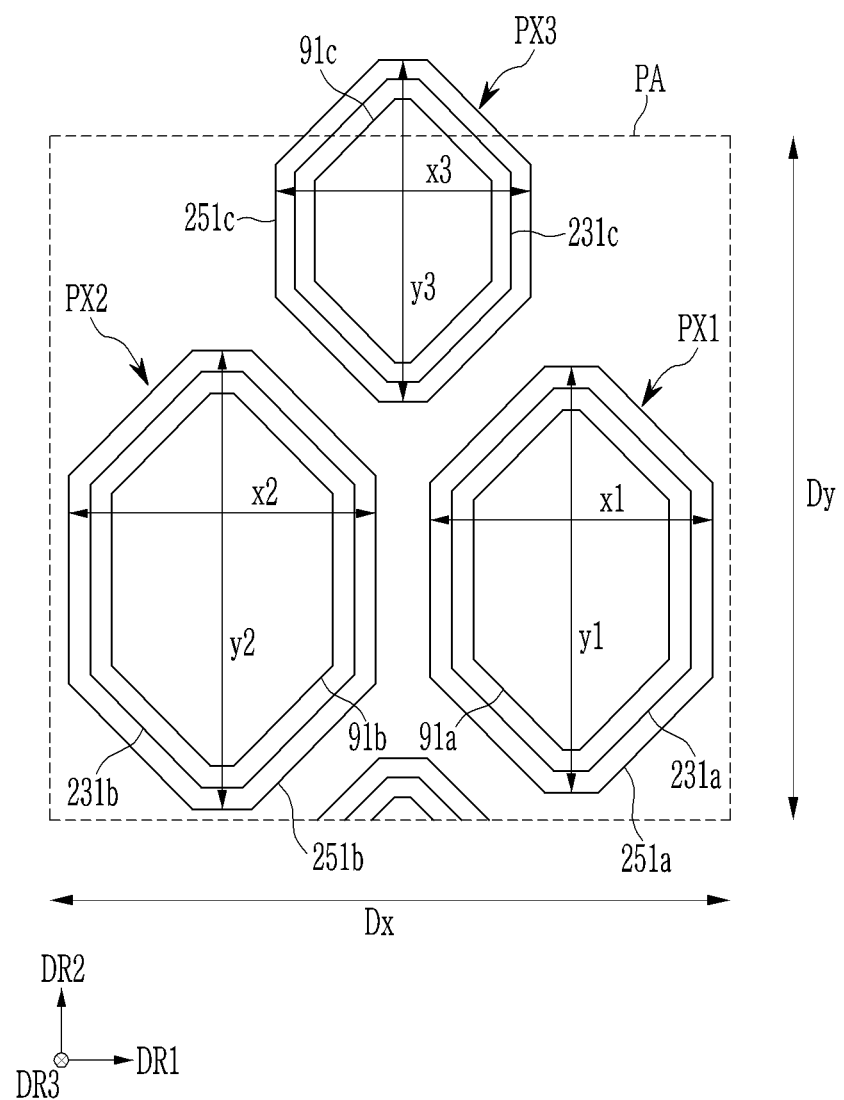
FIG. 2 illustrates some of a plurality of pixels of the display device of FIG. 1.

Pixel arrangement of a display device according to an embodiment will be described with reference to FIG. 1 and FIG. 2. FIG. 1 illustrates a layout view of a plurality of pixels of a display device according to an embodiment, and FIG. 2 illustrates some of a plurality of pixels of the display device of FIG. 1.

Referring to FIG. 1, a display device includes a plurality of first pixels PX1, a plurality of second pixels PX2, and a plurality of third pixels PX3, which display different colors. The plurality of first pixels PX1 and the plurality of second pixels PX2 are alternately disposed along the first direction DR1, and the plurality of first pixels PX1 and the plurality of second pixels PX2 are disposed to be spaced a predetermined interval apart from each other along the second direction DR2.

The plurality of third pixels PX3 are disposed to be spaced a predetermined interval apart from each other along the first direction DR1 and the second direction DR2.

In this case, a plurality of first pixels PX1 and a plurality of second pixels PX2 disposed to be adjacent to each other are alternately disposed with a plurality of third pixels PX3 along the second direction DR2. More specifically, the plurality of third pixels PX3 are alternately disposed with the plurality of first pixels PX1 along the second direction DR2, and simultaneously, the plurality of third pixels PX3 are alternately displaced with the plurality of second pixels PX2 along the second direction DR2.

Accordingly, as indicated by a first dotted line D1 in FIG. 1, a line connecting centers of one first pixel PX1, one second pixel PX2, and one third pixel PX3 that are adjacent to each other may have a triangle-shaped. One first pixel PX1, one second pixel PX2, and one third pixel PX3 disposed to be adjacent to each other may form a dot P which is one unit pixel.

In FIG. 1, an example of one dot P is indicated by a second dotted line D2. In FIG. 1, an area defined by a third dotted line D3 and a fourth dotted line D4 which extend along the first direction DR1 and the second direction DR2, respectively, may equal to an equivalent planar area occupied by one dot P.

Hereinafter, one first pixel PX1, one second pixel PX2, and one third pixel PX3, and the equivalent planar area PA of one dot P will be described with reference to FIG. 2.

The first pixel PX1 has a polygonal planar shape with a first horizontal width x1 which is a maximum width measured in the first direction DR1 and with a first vertical width y1 which is a maximum width measured in the second direction DR2. In this case, the first vertical width y1 may be larger than the first horizontal width x1. That is, an aspect ratio (y1/x1) of the first pixel PX1 may be greater than 1.

Similarly, the second pixel PX2 has a polygonal planar shape with a second horizontal width x2 which is a maximum width measured in the first direction DR1 and with a second vertical width y2 which is a maximum width measured in the second direction DR2. In this case, the second vertical width y2 may be larger than the second horizontal width x2. That is, an aspect ratio (y2/x2) of the second pixel PX2 may be greater than 1.

Similarly, the third pixel PX3 has a polygonal planar shape with a third horizontal width x3 which is a maximum width measured in the first direction DR1 and with a third vertical width y3 which is a maximum width measured in the second direction DR2. In this case, the third vertical width y3 may be larger than the third horizontal width x3. That is, an aspect ratio (y3/x3) of the third pixel PX3 may be greater than 1.

The first pixel PX1, the second pixel PX2, and the third pixel PX3 may have octagonal planar shapes, but the shape of the first pixel PX1, the second pixel PX2, and the third pixel PX3 are not limited thereto and may have a planar shape having at least five or more sides.

In addition, the equivalent planar area PA of one dot P may have a first horizontal length Dx measured in the first direction DR1 and a first vertical length Dy measured in the second direction DR2.

The first horizontal length Dx of the equivalent planar area PA of one dot P may be larger than a sum of the first horizontal width x1 of the first pixel PX1 and the second horizontal width x2 of the second pixel PX2 adjacent to each other in the first direction DR1.

The first vertical length Dy of the equivalent planar area PA of one dot P may be smaller than a sum of the first vertical width y1 of the first pixel PX1 and the third vertical width y3 of the third pixel PX3 adjacent in the second direction DR2, and similarly, the first vertical length Dy thereof may be smaller than a sum of the second vertical width y2 of the second pixel PX2 and the third vertical width y3 of the third pixel PX3 adjacent in the second direction DR2.

As such, one first pixel PX1, one second pixel PX2, and one third pixel PX3 may be disposed without increasing the equivalent planar area PA of one dot P.

The first pixel PX1 described above may be a red pixel displaying red, the second pixel PX2 may be a green pixel displaying green, and the third pixel PX3 may be a blue pixel displaying blue. However, this is an example, and the color displayed by each pixel may be altered.

Figure 3:
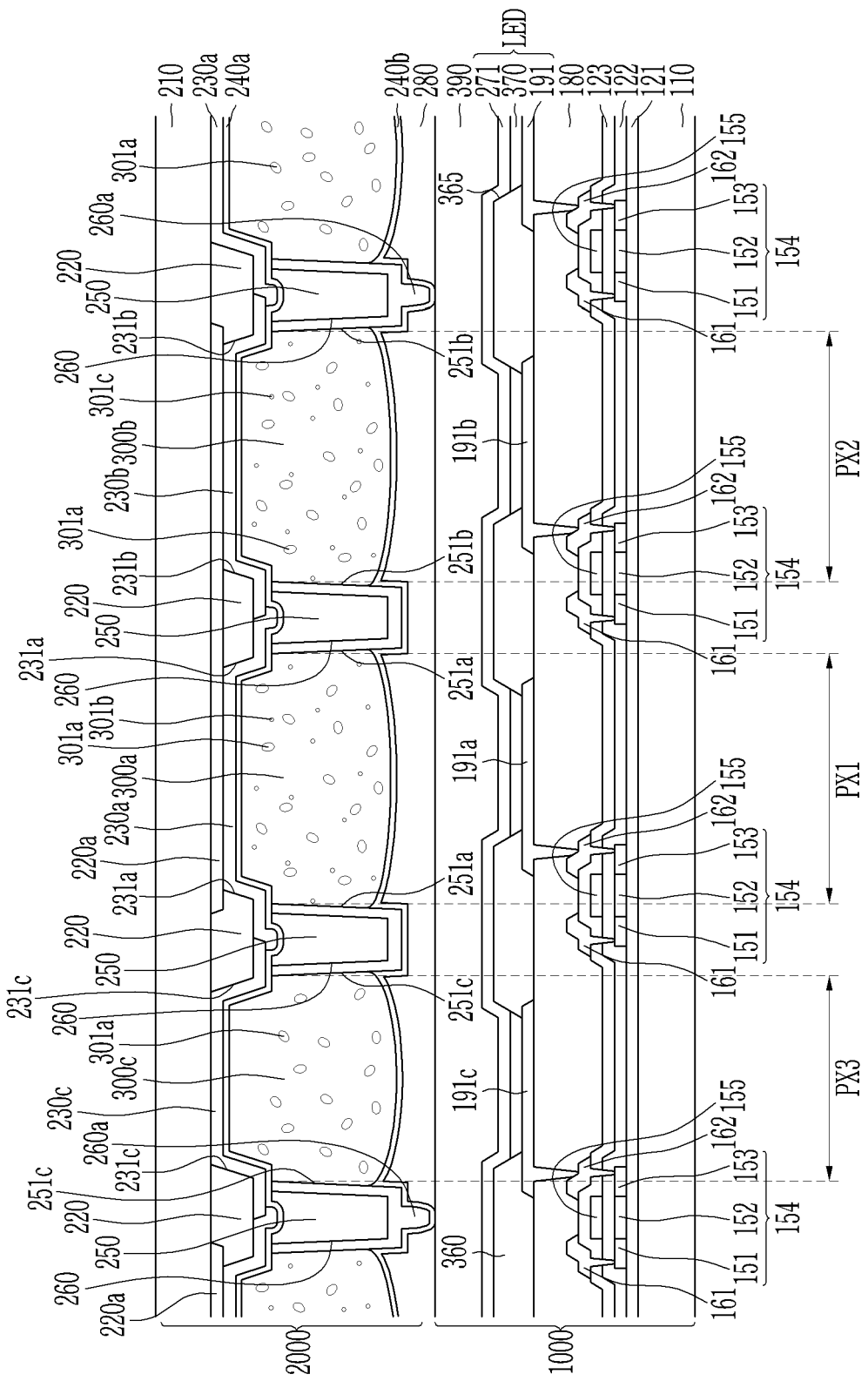
FIG. 3 illustrates a cross-sectional view of a display device according to an embodiment.

Hereinafter, a structure of a display device according to an embodiment will be described in more detail with reference to FIG. 3 along with FIG. 2. FIG. 3 illustrates a cross-sectional view of a display device according to an embodiment.

First, referring to FIG. 3, a display device according to an embodiment includes a display panel 1000 and a color conversion panel 2000. Although not shown, the display device may further include a touch portion, and the touch portion may be disposed between the display panel 1000 and the color conversion panel 2000.

First, the display panel 1000 will be described.

The display panel 1000 includes a first substrate 110. A barrier layer 121 is disposed on the first substrate 110. The first substrate 110 may include a flexible material such as plastic that may be easily curved, bent, folded, or rolled.

The barrier layer 121 may include a silicon oxide ($SiO_x$), a silicon nitride ($SiN_x$), a silicon oxynitride ($SiO_xN_y$), or an amorphous silicon (a-Si). The barrier layer 121 may be disposed between the first substrate 110 and a semiconductor layer 154 to prevent unnecessary components such as impurities or moisture from penetrating into the semiconductor layer 154 and may flatten the first substrate 110 to alleviate stress of the semiconductor layer 154 formed on the barrier layer 121.

The semiconductor layer 154 is disposed on the barrier layer 121. The semiconductor layer 154 may be formed of a polysilicon or oxide semiconductor. The semiconductor layer 154 includes a channel region 152, a source region 151, and a drain region 153. The source region 151 and the drain region 153 are disposed at respective sides of the channel region 152. The channel region 152 is an intrinsic semiconductor that is not doped with impurities and the source region 151 and the drain region 153 are impurity semiconductors doped with conductive impurities. The semiconductor layer 154 may be formed of an oxide semiconductor, and in this case, a separate protective layer (not shown) may be added to protect an oxide semiconductor material that is vulnerable to external environments such as a high temperature.

A gate insulating layer 122 covering the semiconductor layer 154 is disposed. The gate insulating layer 122 may include a silicon oxide ($SiO_x$), a silicon nitride ($SiN_x$), or a silicon oxynitride ($SiO_xN_y$), and may have a single-layered or multi-layered structure including the same.

A gate electrode 155 is disposed on the gate insulating layer 122, and the gate electrode 155 may contain one of copper (Cu), aluminum (Al), molybdenum (Mo), titanium (Ti), chromium (Cr), and tantalum (Ta), and may have a single-layered or multi-layered structure including the same.

An interlayer insulating layer 123 is disposed on the gate electrode 155 and the gate insulating layer 122. The interlayer insulating layer 123 may include a silicon oxide ($SiO_x$), a silicon nitride ($SiN_x$), or a silicon oxynitride ($SiO_xN_y$). Openings exposing the source region 151 and the drain region 153, respectively, are disposed in the interlayer insulating layer 123.

A source electrode 161 and a drain electrode 162 are disposed on the interlayer insulating layer 123. The source electrode 161 and the drain electrode 162 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including the same. For example, the source electrode 161 and the drain electrode 162 may have a triple-layered structure of a lower layer containing a refractory metal such as molybdenum, chromium, tantalum, and titanium, or an alloy thereof; an intermediate layer containing an aluminum-based metal, a silver-based metal, and a copper-based metal that have low resistivity; and an upper layer containing a refractory metal such as molybdenum, chromium, tantalum, and titanium.

The source electrode 161 and the drain electrode 162 are connected to the source region 151 and the drain region 153 of the semiconductor layer 154 through openings formed in the interlayer insulating layer 123 and the gate insulating layer 122, respectively.

A passivation film 180 is disposed on the interlayer insulating layer 123, the source electrode 161, and the drain electrode 162. The passivation layer 180 may include an organic insulating material such as a general purpose polymer, for example, poly(methylmethacrylate) (PMMA) or polystyrene (PS), a polymer derivative having a phenolic group, an acryl-based polymer, an imide-based polymer, a polyimide, an acryl-based polymer, and a siloxane-based polymer.

Since the passivation film 180 covers the interlayer insulating layer 123, the source electrode 161, and the drain electrode 162 to flatten them, a pixel electrode 191 may be formed on the passivation film 180 without a step.

A plurality of pixel electrodes 191 including a first pixel electrode 191a, a second pixel electrode 191b, and a third pixel electrode 191c are disposed on the passivation film 180. Each pixel electrode 191 is connected to the respective drain electrode 162 through the opening of the passivation film 180.

A driving transistor including the gate electrode 155, the semiconductor layer 154, the source electrode 161, and the drain electrode 162 is connected to the pixel electrode 191 to supply a driving current to a light emitting element LED. In addition to the driving transistor shown in FIG. 3, the display device according to the present embodiment may further include a switching transistor (not shown) connected to a data line (not shown) and transmitting a data voltage in response to a scan signal, and a compensation transistor (not shown) connected to the driving transistor and compensating for a threshold voltage of the driving transistor in response to a scan signal.

A pixel defining layer 360 is disposed on the passivation film 180 and the plurality of pixel electrodes 191, and the pixel defining layer 360 has a plurality of pixel openings 365 overlapping the plurality of pixel electrodes 191 and defining a light emitting area. The pixel defining layer 360 may include an organic material such as a polyacrylate resin and a polyimide resin, or a silica-based inorganic material. The plurality of pixel openings 365 may have a planar shape that is substantially similar to that of the pixel electrode 191. The plurality of pixel openings 365 may have a planar rhombus or octagonal shape similar to a rhombus, but are not limited thereto, and may have various shapes such as a quadrangular shape and a polygonal shape.

A light emitting layer 370 is disposed on the pixel electrode 191 exposed by the pixel opening 365. The light emitting layer 370 may include an inorganic material or an organic material.

For example, the light emitting layer 370 may be made of a low-molecular organic material or a high-molecular organic material such as poly(3,4-ethylenedioxythiophene) (PEDOT). In addition, the light emitting layer 370 may be a multifilm further including one or more of a hole injection layer (HIL), a hole transporting layer (HTL), an electron transporting layer (ETL), and an electron injection layer (EIL).

Most of the light emitting layer 370 may be disposed within the pixel opening 365 and may also be disposed at a side or upper portion of the pixel defining layer 360.

A common electrode 271 is disposed on the light emitting layer 370. The common electrode 271 may be disposed over a plurality of pixels and may receive a common voltage through a common voltage transmitting portion (not shown) in a non-display area.

The pixel electrode 191, the light emitting layer 370, and the common electrode 271 may form the light emitting element LED.

Here, the pixel electrode 191 may be an anode which is a hole injection electrode, and the common electrode 271 may be a cathode which is an electron injection electrode. However, the embodiment is not necessarily limited thereto, and the pixel electrode 191 may be a cathode and the common electrode 271 may be an anode according to a driving method of the display device.

Holes and electrons are injected into the light emitting layer 370 from the pixel electrode 191 and the common electrode 271, respectively, and light is emitted when excitons in which the injected holes and electrons are combined enter a ground state from an excited state.

An encapsulation layer 390 is disposed on the common electrode 271. The encapsulation layer 390 may cover upper and lateral surfaces of the display layer including the light emitting element LED to seal the display layer.

The encapsulation layer 390 seals the display layer to block external moisture and oxygen from being introduced. The encapsulation layer 390 may include a plurality of layers and may be formed as a composite film including both an inorganic film and an organic film. The encapsulation layer 390 may be formed as a triple layer in which an inorganic film, an organic film, and an inorganic film are sequentially formed.

The color conversion panel 2000 is disposed on the encapsulation layer 390.

The color conversion panel 2000 includes a second substrate 210 facing the first substrate 110 of the display panel 1000. The second substrate 210 may include a flexible material such as plastic that may be easily curved, bent, folded, or rolled.

A light blocking member (black matrix) 220, first to third color filters 230a, 230b, and 230c, a first insulation layer 240a, a partition wall 250, a cover layer 260, a spacer 260a, a transparent filter layer 300c, a first color conversion layer 300a, a second color conversion layer 300b, and a second insulation layer 240b are disposed between the second substrate 210 and the display panel 1000, and a filling layer 280 is disposed between the second insulation layer 240b and the display panel 1000. A blocking layer 220a is disposed between the second substrate 210, and the second color filter 230b and third color filter 230c.

The light blocking member 220 prevents light passing through the transparent filter layer 300c, the first color conversion layer 300a and the second color conversion layer 300b from being mixed, thereby increasing a contrast ratio of the display device. According to another embodiment, instead of the light blocking member 220, the first to third color filters 230a, 230b, and 230c may overlap each other in the third direction DR3 to block light.

The first color filter 230a, the second color filter 230b, and the third color filter 230c are disposed between the light blocking member 220 and the first substrate 110.

The blocking layer 220a is disposed between the second color filter 230b and the second substrate 210, and between the third color filter 230c and the second substrate 210. The blocking layer 220a is not disposed in an area overlapping the third color filter 230c.

The first insulation layer 240a is disposed between the first color filter 230a, second color filter 230b, and third color filter 230c, and the first substrate 110. The first insulation layer 240a prevents components of the first color filter 230a, the second color filter 230b, and the third color filter 230c from diffusing to the outside.

The partition wall 250 is disposed at a position overlapping the light blocking member 220. The partition wall 250 may define an area in which the first color conversion layer 300a, the second color conversion layer 300b, and the transparent filter layer 300c are disposed.

The cover layer 260 and the spacer 260a are disposed on a bottom surface and a side surface of the partition wall that do not contact the first insulation layer 240a.

The cover layer 260 and the spacer 260a are simultaneously formed of the same layer, may include a transparent organic material, and may be a hydrophobic layer which repels liquid.

When the first color conversion layer 300a, the second color conversion layer 300b, and the transparent filter layer 300c are formed by an inkjet method, the cover layer 260 having hydrophobicity helps discharged liquid forming the first color conversion layer 300a, the second color conversion layer 300b, and the transparent filter layer 300c not to be formed on the partition wall 250 overlapping the light blocking member 220.

The spacers 260a protruding from a portion of the cover layer 260 may constantly maintain gaps between the display panel 1000 and the first color conversion layer 300a, the second color conversion layer 300b, and the transparent filter layer 300c.

In the area defined by the partition wall 250, the first color conversion layer 300a, the second color conversion layer 300b, and the transparent filter layer 300c are disposed.

The display panel 1000 may emit light of a first wavelength to the color conversion panel 2000.

The first color conversion layer 300a converts light having the first wavelength incident from the display panel 1000 into light having a second wavelength. The first color conversion layer 300a includes a plurality of scatterers 301a and a plurality of first quantum dots 301b. The second color conversion layer 300b converts the light having the first wavelength incident from the display panel 1000 into light having a third wavelength. The second color conversion layer 300b includes a plurality of scatterers 301a and a plurality of second quantum dots 301c.

The transparent filter layer 300c transmits the light of the first wavelength. The transparent filter layer 300c includes a plurality of scatterers 301a.

The light of the first wavelength may be blue light having a peak wavelength of about 380 nm to about 480 nm, for example, about 420 nm or more, about 430 nm or more, about 440 nm or more, or about 445 nm or more, and about 470 nm or less, about 460 nm or less, or about 455 nm or less.

The light of the second wavelength may be green light having a peak wavelength of about 500 nm to about 550 nm, for example, about 510 nm to about 550 nm.

The light of the third wavelength may be red light having a ma peak wavelength of about 600 nm to about 650 nm, for example, about 620 nm to about 650 nm.

The plurality of scatterers 301a scatter light incident on the first color conversion layer 300a, the second color conversion layer 300b, and the transparent filter layer 300c, thereby increasing light efficiency.

The first quantum dot 301b and the second quantum dot 301c may be selected from a group II-VI compound, a group III-V compound, a group IV-VI compound, a group IV element, a group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof.

The Group IV element may be selected from Si, Ge, and a mixture thereof.

The Group IV compound may be a two-element compound selected from SiC, SiGe, and a mixture thereof.

In this case, the two-element compound, the three-element compound, or the four-element compound may be present in particles at uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

Further, a shape of the quantum dot is not particularly limited to a shape generally used in the art, and may be a spherical, pyramidal, multi-arm, or cubic nanoparticle, nanotube, nano-wire, nano-fiber, nano-plate particle shape, and the like.

The second insulation layer 240b is disposed between the first color conversion layer 300a, the second color conversion layer 300b, and the transparent filter layer 300c and the display panel 1000. The second insulation layer 240b covers and protects the first color conversion layer 300a, the second color conversion layer 300b, and the transparent filter layer 300c so that, when the color conversion panel 2000 is attached to the display panel 1000, a component of the filling layer 280 is prevented from being introduced into the first color conversion layer 300a, the second color conversion layer 300b, and the transparent filter layer 300c.

The light of the first wavelength emitted from the display panel 1000 is incident onto the first color conversion layer 300a, the second color conversion layer 300b, and the transparent filter layer 300c so that the light of the first wavelength is converted into the light of the second wavelength and emitted toward the second substrate 210 in an area of the first pixel PX1 in which the first color conversion layer 300a is disposed, and the light of the first wavelength is converted into the light of the third wavelength and emitted toward the second substrate 210 in an area of the second pixel PX2 in which the second color conversion layer 300b is disposed. In addition, in an area of the third pixel PX3 in which the transparent filter layer 300c is disposed, the light of the first wavelength is scattered and transmitted to emit light toward the second substrate 210.

In this case, color purity is increased by the color filters 230a, 230b, and 230c disposed between the first color conversion layer 300a, the second color conversion layer 300b, and the transparent filter layer 300c and the second substrate 210.

More specifically, since the first color filter 230a may transmit the light of the second wavelength and absorb light of the remaining wavelength, the purity of the light of the second wavelength emitted toward the second substrate 210 may be increased, and similarly, since the second color filter 230b may transmit the light of the third wavelength and absorb light of the remaining wavelength, the purity of the light of the second wavelength emitted toward the second substrate 210 may be increased. In addition, since the third color filter 230c may transmit the light of the first wavelength that has passed through the transparent filter layer 300c, and may absorb light of the remaining wavelength, the purity of the light of the first wavelength emitted toward the second substrate 210 may be increased.

The blocking layer 220a, which is disposed to overlap the first color conversion layer 300a and the second color conversion layer 300b, blocks light of the first wavelength that is not color-converted in the first color conversion layer 300a and the second color conversion layer 300b and is emitted toward the second substrate 210 so that it is possible to increase the purity of the light of the second and third wavelengths.

More specifically, the blocking layer 220a may substantially block the light of the first wavelength and transmit light of the remaining wavelength. For example, the blocking layer 220a may substantially block blue light of about 500 nm or less and transmit light in the remaining visible light wavelength range of, for example, larger than about 500 nm to about 700 nm or less.

For example, the blocking layer 220a may absorb about 80% or more, about 90% or more, or about 95% or more of blue light of about 500 nm or less, and may have light transmittance of about 70% or more, about 80% or more, about 90%, or about 100% with respect to light in the remaining visible light range of larger than about 500 nm to about 700 nm or less.

According to another embodiment, the blocking layer 220a may be omitted.

The light blocking member 220, the partition wall 250, and the cover layer 260 are disposed to overlap the opaque area of the display panel 1000, and the color filters 230a, 230b, and 230c, the first color conversion layer 300a, the second color conversion layer 300b, and the transparent filter layer 300c are disposed to overlap the light emitting area of the display panel 1000.

Most of the first color filter 230a, the second color filter 230b, and the third color filter 230c may be disposed within an area defined by an edge of the light blocking member 220, and a portion thereof may overlap the light blocking member 220. The first color filter 230a, the second color filter 230b, and the third color filter 230c are disposed within an area defined by an edge of the light blocking member 220 to have a first color filter area 231a, a second color filter area 231b, and a third color filter area 231c that do not overlap the light blocking member 220.

The first color conversion layer 300a, the second color conversion layer 300b, and the transparent filter layer 300c are disposed within an area defined by the partition wall 250 and the cover layer 260, and the first color conversion layer 300a, the second color conversion layer 300b, and the transparent filter layer 300c include a first color conversion area 251a, a second color conversion area 251b, and a third color conversion area 251c which are defined by the partition wall 250 and the cover layer 260, respectively.

Referring back to FIG. 2 together with FIG. 3, an area of each of the first color filter area 231a of the first pixel PX1, the second color filter area 231b of the second pixel PX2, and the third color filter area 231c of the third pixel PX3 may be larger than that of each of a first light emitting area 91a overlapping the first pixel electrode 191a and the light emitting layer 370 of the first pixel PX1 to emit light, a second light emitting area 91b overlapping the second pixel electrode 191b and the light emitting layer 370 of the second pixel PX2 to emit light, and a third light emitting area 91c overlapping the third pixel electrode 191c and the light emitting layer 370 of the third pixel PX3 to emit light.

The first light emitting area 91a in which the first pixel electrode 191a and the light emitting layer 370 overlap of the first pixel PX1, the second light emitting area 91b in which the second pixel electrode 191b and the light emitting layer 370 of the second pixel PX2 overlap, and the third light emitting area 91c in which the third pixel electrode 191c and the light emitting layer 370 of the third pixel PX3 overlap may be areas in which the first pixel electrode 191a of the first pixel PX1, the second pixel electrode 191b of the second pixel PX2, and the third pixel electrode 191c of the third pixel PX3 respectively overlap the pixel opening 365.

In addition, an area of each of the first color conversion area 251a of the first pixel PX1, the second color conversion area 251b of the second pixel PX2, and the third color conversion area 251c of the third pixel PX3 may be wider than that of each of the first color filter area 231a, the second color filter area 231b, and the third color filter area 231c.

Figure 4:
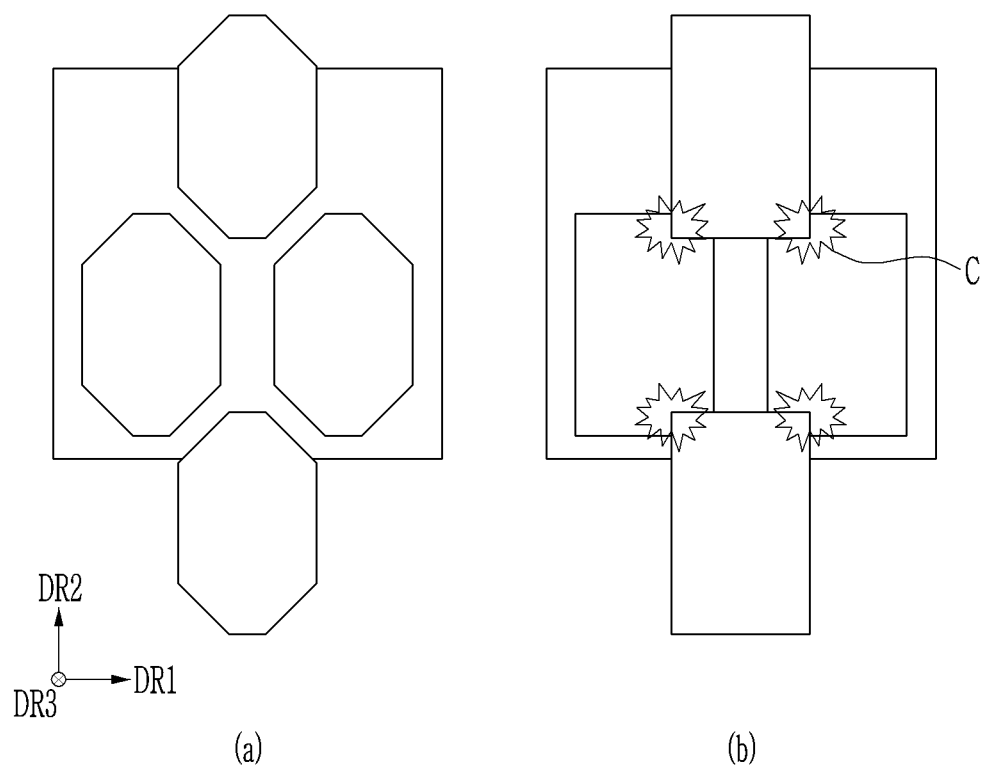
FIG. 4 illustrates an example of arrangement of a plurality of pixels.

Hereinafter, a pixel arrangement of a display device according to an embodiment will be described in more detail with reference to FIG. 4 along with FIG. 1. FIG. 4 illustrates an example of arrangement of a plurality of pixels.

FIG. 4(a) shows an example of arrangement of a plurality of pixels of the display device according to the embodiment shown in FIG. 1, and FIG. 4(b) shows an example of arrangement of a plurality of pixels of a conventional display device.

As described above, the first color conversion layer 300a, the second color conversion layer 300b, and the transparent filter layer 300c may be formed by an inkjet method.

When an inkjet nozzle is scanned in the first direction DR1 and a solution including the first color conversion layer 300a, the second color conversion layer 300b, and the transparent filter layer 300c is discharged, as widths in the first direction DR1 of the first color conversion area 251a, the second color conversion area 251b, and the third color conversion area 251c defined by the partition wall 250 and the cover layer 260 increase, a length scanned by the inkjet nozzle in the first direction DR1 increases, and thus an inkjet process time increases. Therefore, it is advantageous that the first vertical width y1, the second vertical width y2, and the third vertical width y3 measured in the second direction DR2 of the first pixel PX1, the second pixel PX2, and the third pixel PX3 is longer than the first horizontal width x1, the second horizontal width x2, and the third horizontal width x3 measured in the first direction DR1 thereof.

Referring to FIG. 4(a) along with FIG. 1 and FIG. 2, as described above, in the plurality of pixels of the display device according to the embodiment, the first color conversion area 251a of the first pixel PX1, the second color conversion area 251b of the second pixel PX2, and the third color conversion area 251c of, the third pixel PX3 may each have polygonal planar shapes with an aspect ratio that is greater than 1, so when the first color conversion layer 300a, the second color conversion layer 300b, and the transparent filter layer 300c are formed by an inkjet method, the efficiency of the inkjet process may be improved.

In addition, the first pixel PX1 and the second pixel PX2 are alternately disposed along the first direction DR1, the first pixel PX1 and the third pixel PX3 are alternately disposed along the second direction DR2, and the second pixel PX2 and the third pixel PX3 are alternately disposed along the second direction DR2, thus one first pixel PX1, one second pixel PX2, and one third pixel PX3 may be disposed without increasing the equivalent planar area PA of one dot P.

Referring to FIG. 4(b), when a plurality of pixels having the same quadrangular planar shape as the aspect ratio (y1/x1) of the first pixel PX1, the aspect ratio (y2/x2) of the second pixel PX2, and the aspect ratio (y3/x3) of the third pixel PX3 of the conventional display device are disposed at a similar planar position to that of the display device according to the embodiment, since portions (c) overlapping each other occur at vertex portions of the quadrangular plane of each pixel, a wide interval is required between the pixels in order to prevent overlapping of different pixels. This means that the area occupied by the same number of pixels becomes wider, and thus causes deterioration of resolution of the display device.

As described above, according to the display device of the embodiment, it is possible to dispose one first pixel PX1, one second pixel PX2, and one third pixel PX3 without increasing the equivalent planar area PA of one dot P. Thus, when the first color conversion layer 300a, the second color conversion layer 300b, and the transparent filter layer 300c are formed by the inkjet method, the efficiency of the inkjet process may be improved.

Figure 5:
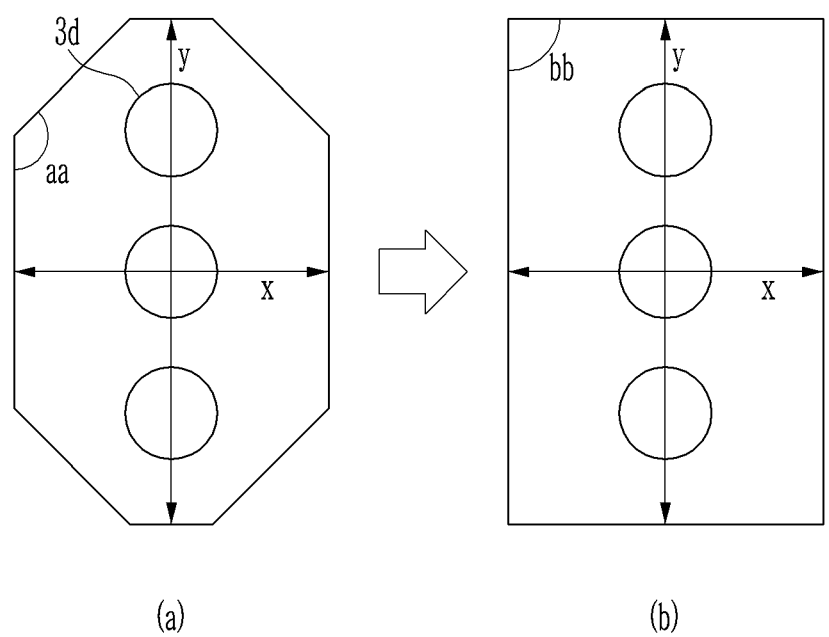
FIG. 5 illustrates an example of a planar shape of a color conversion area of one pixel.

Hereinafter, a planar shape of a pixel of the display device according to the embodiment will be described in more detail with reference to FIG. 5. FIG. 5 illustrates an example of a planar shape of one pixel.

FIG. 5(a) illustrates an example of a planar shape of a color conversion area of a pixel of the display device according to the embodiment shown in FIG. 1, and FIG. 5(b) illustrates an example of a planar shape of a color conversion area of a pixel of a conventional display device. In FIG. 5, arrows indicate scan directions of an inkjet nozzle when the first color conversion layer 300a, the second color conversion layer 300b, and the transparent filter layer 300c of the display device are formed by an inkjet method. In addition, FIG. 5 conceptually illustrates a solution 3d discharged from a nozzle of an inkjet device.

As described above, each of the color conversion area of the plurality of pixels of the display device according to the embodiment may have, for example, an octagonal planar shape, and may have a planar shape having at least five or more sides. In FIG. 5(a), a case in which the color conversion area of the octagonal plane shape is illustrated. Hereinafter, the color conversion area having the octagonal plane shape will be described.

Referring to FIG. 5(a), a first angle (aa) formed by two sides adjacent to each vertex in the planar shape of the color conversion area of the pixel of the display device according to the embodiment is larger than a second angle (bb) formed by two sides adjacent to a vertex of a color conversion area of a pixel having a quadrangular planar shape shown in FIG. 5(b). As such, since the first angle (aa) of the vertex is relatively large, when the first color conversion layer 300a, the second color conversion layer 300b, and the transparent filter layer 300c are formed by the inkjet method, the solution 3d forming the first color conversion layer 300a, the second color conversion layer 300b, and the transparent filter layer 300c discharged from the inkjet nozzle may well spread up to a portion adjacent to the vertex.

Therefore, according to the display device according to the embodiment, when the first color conversion layer 300a, the second color conversion layer 300b, and the transparent filter layer 300c of the display device are formed by the inkjet method, the process efficiency may be improved.

Figure 6:
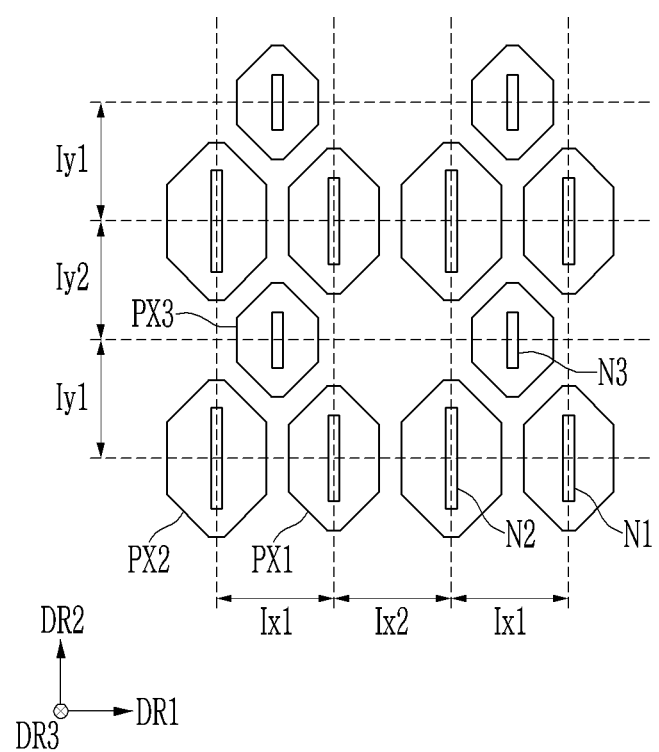
FIG. 6 illustrates an example of arrangement of color conversion area of a plurality of pixels of a display device according to an embodiment.

Hereinafter, arrangement of pixels of the display device according to the embodiment will be described in more detail with reference to FIG. 6. FIG. 6 illustrates an example of arrangement of a plurality of pixels of a display device according to an embodiment.

FIG. 6 conceptually illustrates positions of a first nozzle N1, a second nozzle N2, and a third nozzle N3 of the inkjet device for forming the first color conversion layer 300a, the second color conversion layer 300b, and the transparent filter layer 300c of a plurality of first pixels PX1, a plurality of second pixels PX2, and a plurality of third pixels PX3 along with arrangement of the plurality of first pixels PX1, the plurality of second pixels PX2, and the plurality of third pixels PX3.

The first color conversion layer 300a of the first pixel PX1 is formed by a solution discharged from the first nozzle N1 of the inkjet device, and the second color conversion layer 300b of the second pixel PX2 is formed by a solution discharged from the second nozzle N2 of the inkjet device. Similarly, the transparent filter layer 300c of the third pixel PX3 is formed by a solution discharged from the third nozzle N3 of the inkjet device.

Referring to FIG. 6, a first horizontal distance Ix1 between a center of the second nozzle N2 for forming the second color conversion layer 300b of the second pixel PX2 and a center of the first nozzle N1 for forming the first color conversion layer 300a of the first pixel PX1 that are measured along the first direction DR1 may be equal to a second horizontal distance Ix2 between the first nozzle N1 and another second nozzle N2 adjacent to the first nozzle N1.

In addition, a first vertical distance Iy1 between a center of the first nozzle N1 or a center of a second nozzle N2 and a center of the third nozzle N3 to form the transparent filter layer 300c of the third pixel PX3 that is measured along the second direction DR2 may be equal to a second vertical distance Iy2 between the center of the third nozzle N3 and another first nozzle N1 or another second nozzle N2 disposed adjacent to the third nozzle N3.

When distances between centers of adjacent nozzle are not uniform, and when the solution is discharged into the color conversion area surrounded by the partition wall of each pixel in the inkjet process, the solutions discharged from the inkjet nozzle into the color conversion area surrounded by the partition wall of the pixels may be mixed each other in the color conversion area surrounded by the partition wall of each pixel.

However, according to the arrangement of the plurality of pixels of the display device according to the embodiment, as the distance between adjacent nozzles is maintained constant along the first direction DR1 and the second direction DR2, different solutions discharged from the first nozzle N1, the second nozzle N2, and the third nozzle N3 may be prevented from being mixed with each other during the inkjet process, and. accordingly, the accuracy of the inkjet process for forming the first color conversion layer 300a, the second color conversion layer 300b, and the transparent filter layer 300c of the plurality of first pixels PX1, the plurality of second pixels PX2, and the plurality of third pixels PX3 may be improved.

Hereinafter, a planar shape of a color conversion area of a pixel of a display device according to another embodiment will be described with reference to FIG. 7A to 7D. FIG. 7A to FIG. 7D illustrate planar shapes of a color conversion area of a pixel of the display device according to another embodiment.

Figure 7A:
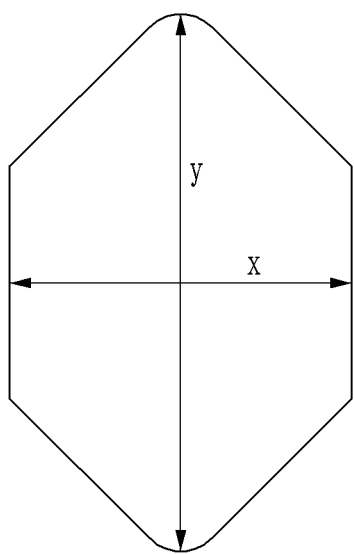
FIGS. 7A, 7B, 7C and FIG. 7D illustrate planar shapes of a color conversion area of a pixel of a display device according to another embodiment.

Referring to FIG. 7A, a planar shape of a color conversion area of a pixel of a display device according to another embodiment is similar to that of the pixel of the display device according to the above-described embodiment.

The planar shape of the color conversion area of the pixel of the display device according to the present embodiment substantially has an octagonal planar shape with an aspect ratio (y/x) of greater than 1, but vertexes on a top side and a bottom side have a rounded shape.

Figure 7B:
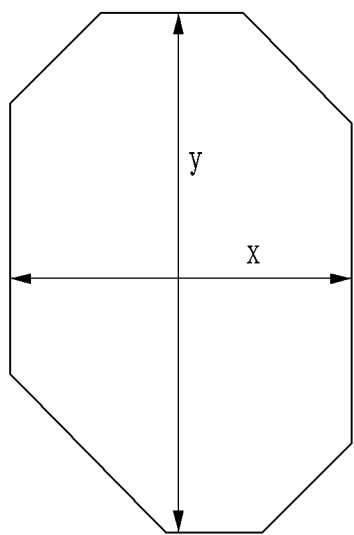

Referring to FIG. 7B, a planar shape of a color conversion area of a pixel of a display device according to another embodiment is similar to that of the color conversion area of the pixel of the display device according to the above-described embodiment.

The planar shape of the color conversion area of the pixel of the display device according to the present embodiment has an octagonal planar shape with an aspect ratio (y/x) of greater than 1, but sides of an upper right direction and a lower left direction are not symmetrical to each other.

Figure 7C:
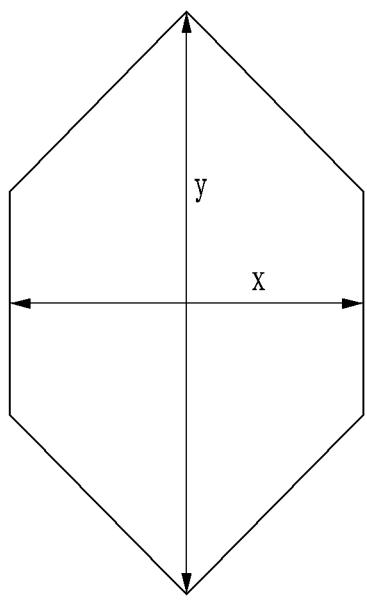

Referring to FIG. 7C, a planar shape of a color conversion area of a pixel of a display device according to another embodiment is similar to that of the color conversion area of the pixel of the display device according to the above-described embodiment.

The planar shape of the color conversion area of the pixel of the display device according to the present embodiment has a hexagonal shape with an aspect ratio (y/x) of greater than 1.

Figure 7D:
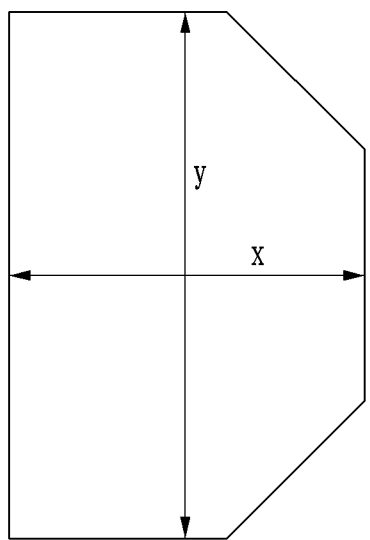

Referring to FIG. 7D, a planar shape of a color conversion area of a pixel of a display device according to another embodiment is similar to that of the color conversion area of the pixel of the display device according to the above-described embodiment.

The planar shape of the pixel of the display device according to the present embodiment has a hexagonal shape with an aspect ratio (y/x) of greater than 1, but includes vertexes having a right angle which are disposed on the left side of the color conversion area.

As described above, the planar shape of the color conversion area of the pixel of the display device according to the embodiment may have a polygonal planar shape having an aspect ratio (y/x) of greater than 1 and may have a planar shape having at least five or more sides.

Hereinafter, a planar shape of a color conversion area of a pixel of a display device according to another embodiment will be described with reference to FIG. 8A to 8D. FIG. 8A to FIG. 8D illustrate a planar shape of a color conversion area of a pixel of a display device according to another embodiment.

FIG. 8A to FIG. 8D illustrate a planar shape of a light emitting area 91 in which the pixel electrode 191 and the light emitting layer 370 of the display device according to another embodiment overlap and emit light; a planar shape of a color filter area 231 in which the color filter defined by the edge of the light blocking member 220 and does not overlap the light blocking member 220 is disposed; and a planar shape of a color conversion area 251 that is defined by the partition wall 250 and the cover layer 260 and in which the first color conversion layer 300a, the second color conversion layer 300b, and the transparent filter layer 300c are formed by the inkjet method.

In FIG. 8A to FIG. 8D, the area defined by the partition wall 250 and the cover layer 260, that is, the planar shape of the color conversion area 251 in which the first color conversion layer 300a, the second color conversion layer 300b, and the transparent filter layer 300c are formed by the inkjet method, has an octagonal planar shape with an aspect ratio of greater than 1, which is similar to the planar shape of the pixel of the display devices according to the embodiments described above.

Figure 8A:
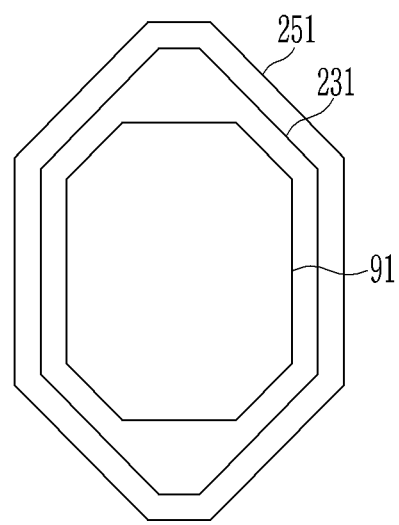
FIGS. 8A, 8B, 8C and FIG. 8D illustrate a planar shape of a color conversion area of a pixel of a display device according to another embodiment.

Referring to FIG. 8A, the planar shape of the color filter area 231 is similar to that of the color conversion area 251. However, the light emitting area 91 in which the pixel electrode 191 and the light emitting layer 370 overlap to emit light has an octagonal shape with a smaller aspect ratio than that of the planar shape of the color filter area 231 or of the planar shape of the color conversion area 251.

Figure 8B:
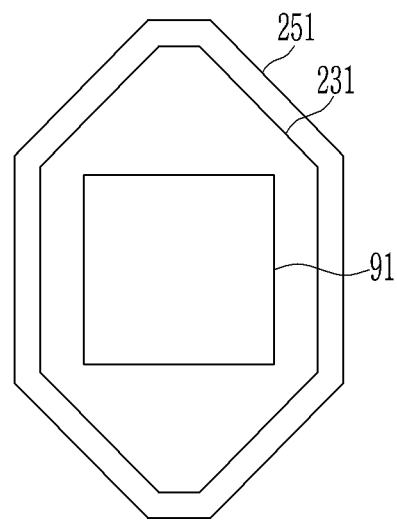

Referring to FIG. 8B, the planar shape of the color filter area 231 is similar to that of the color conversion area 251. However, the light emitting area 91 in which the pixel electrode 191 and the light emitting layer 370 overlap to emit light has a quadrangular planar shape.

Figure 8C:
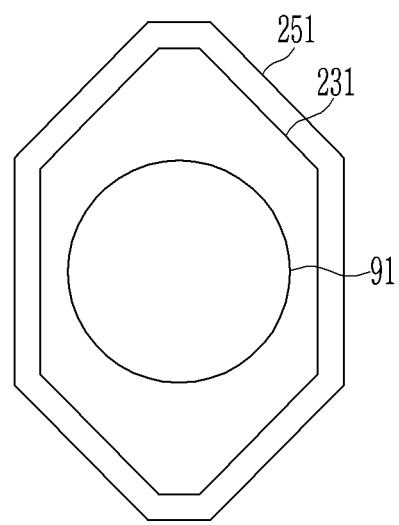

Referring to FIG. 8C, the planar shape of the color filter area 231 is similar to that of the color conversion area 251. However, the light emitting area 91 in which the pixel electrode 191 and the light emitting layer 370 overlap to emit light has a circular planar shape.

Figure 8D:
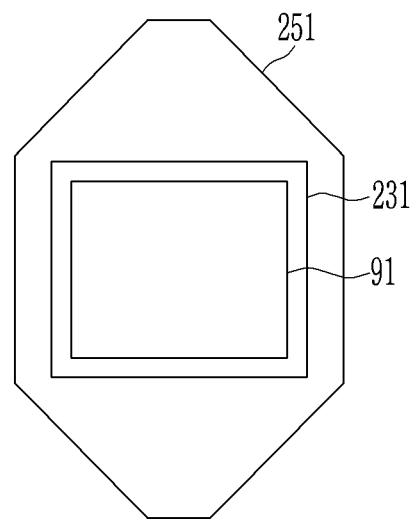

Referring to FIG. 8D, each of the color filter area 231 and the light emitting area 91 has a quadrangular planar shape.

As described above, according to the planar shape of the pixel of the display device according to other embodiments, the planar shape of the color conversion area 251 has the octagonal planar shape with the aspect ratio of greater than 1, but the planar shape of the color filter area 231 and the light emitting area 91 may be similar to the planar shape of the color conversion area 251 or may have different planar shapes from the planar shape of the color conversion area 251, for example, a quadrangular shape, a circular shape, or a polygonal shape having different aspect ratios.

Figure 9:
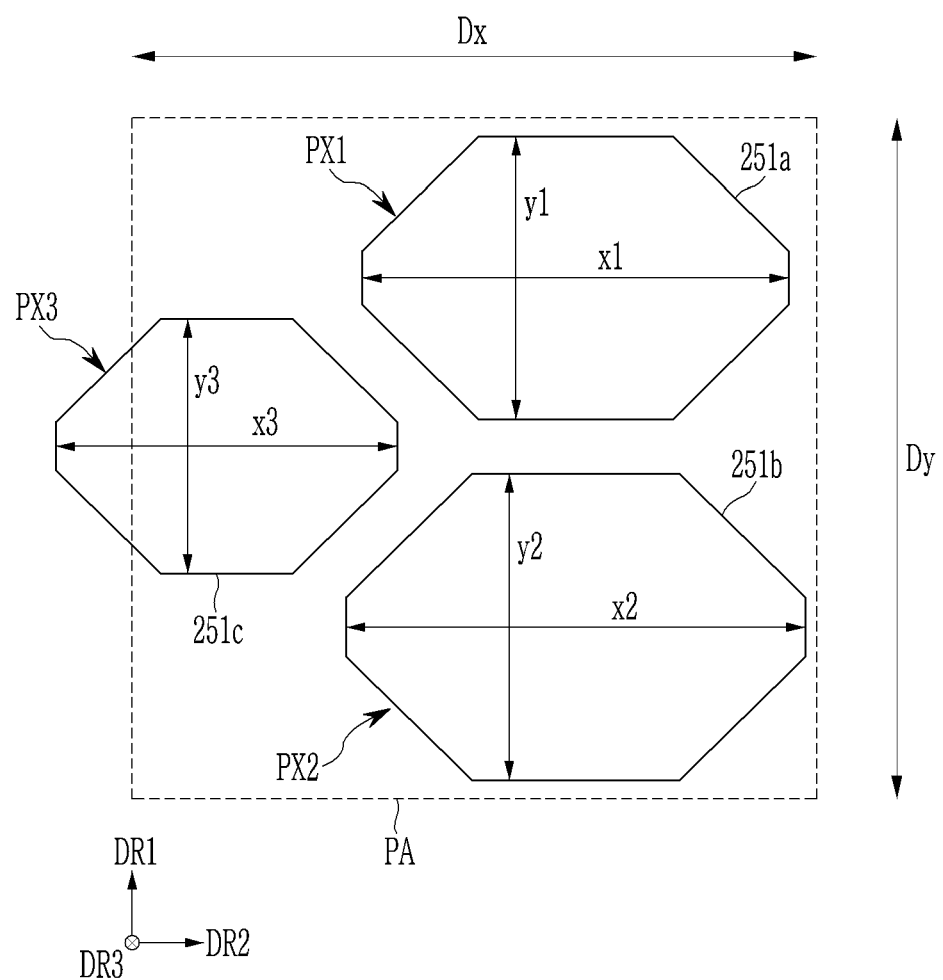
FIG. 9 illustrates a layout view of color conversion areas of a plurality of pixels of a display device according to an embodiment.

Hereinafter, a pixel arrangement of a display device according to another embodiment will be described with reference to FIG. 9. FIG. 9 illustrates a layout view of color conversion areas of a plurality of pixels of a display device according to an embodiment.

Referring to FIG. 9, a display device includes a plurality of first pixels PX1, a plurality of second pixels PX2, and a plurality of third pixels PX3 which display different colors.

The first pixel PX1 and the second pixel PX2 are disposed to be adjacent to each other along the second direction DR2, the third pixel PX3 is alternately disposed with the first pixel PX1 along the first direction DR1, and the third pixel PX3 is alternately disposed with the second pixel PX2 along the first direction DR1.

The first color conversion area 251a of the first pixel PX1 has a polygonal planar shape with a first horizontal width x1 which is a maximum width measured in the first direction DR1 and with a first vertical width y1 which is a maximum width measured in the second direction DR2. In this case, the first vertical width y1 may be smaller than the first horizontal width x1. That is, the aspect ratio (y1/x1) of the first color conversion area 251a of the first pixel PX1 may be smaller than 1.

Similarly, the second color conversion area 251b of the second pixel PX2 has an octagonal planar shape with a second horizontal width x2 which is a maximum width measured in the first direction DR1 and with a second vertical width y2 which is a maximum width measured in the second direction DR2. In this case, the second vertical width y2 may be smaller than the second horizontal width x2. That is, the aspect ratio (y2/x2) of the second color conversion area 251b of the second pixel PX2 may be smaller than 1.

Similarly, the third color conversion area 251c of the third pixel PX3 has an octagonal planar shape with a third horizontal width x3 which is a maximum width measured in the first direction DR1 and with a third vertical width y3 which is a maximum width measured in the second direction DR2. In this case, the third vertical width y3 may be smaller than the third horizontal width x3. That is, the aspect ratio (y3/x3) of the third color conversion area 251c of the third pixel PX3 may be smaller than 1.

An equivalent planar area occupied by one first pixel PX1, one second pixel PX2, and one third pixel PX3, that is, the equivalent planar area PA of one dot P, has a first horizontal length Dx measured in the first direction DR1 and a first vertical length Dy measured in the second direction DR2.

The first horizontal length Dx of the equivalent planar area PA of one dot P may be smaller than a sum of the first horizontal width x1 of the first color conversion area 251a of the first pixel PX1 and the third horizontal width x3 of the third color conversion area 251c of the third pixel PX3 that are adjacent to each other in the first direction DR1, and similarly, the first horizontal length Dx may be smaller than a sum of the second horizontal width x2 of the second color conversion area 251b of the second pixel PX2 and the third horizontal width x3 of the third color conversion area 251c of the third pixel PX3 that are adjacent to each other in the first direction DR1.

The first vertical length Dy of the equivalent planar area PA of one dot P may be larger than a sum of the first vertical width y1 of the first color conversion area 251a of the first pixel PX1 and the second vertical width y2 of the second color conversion area 251b of the second pixel PX2 that are adjacent in the second direction DR2.

As such, one first pixel PX1, one second pixel PX2, and one third pixel PX3 may be disposed without increasing the equivalent planar area PA of one dot P.

Figure 10:
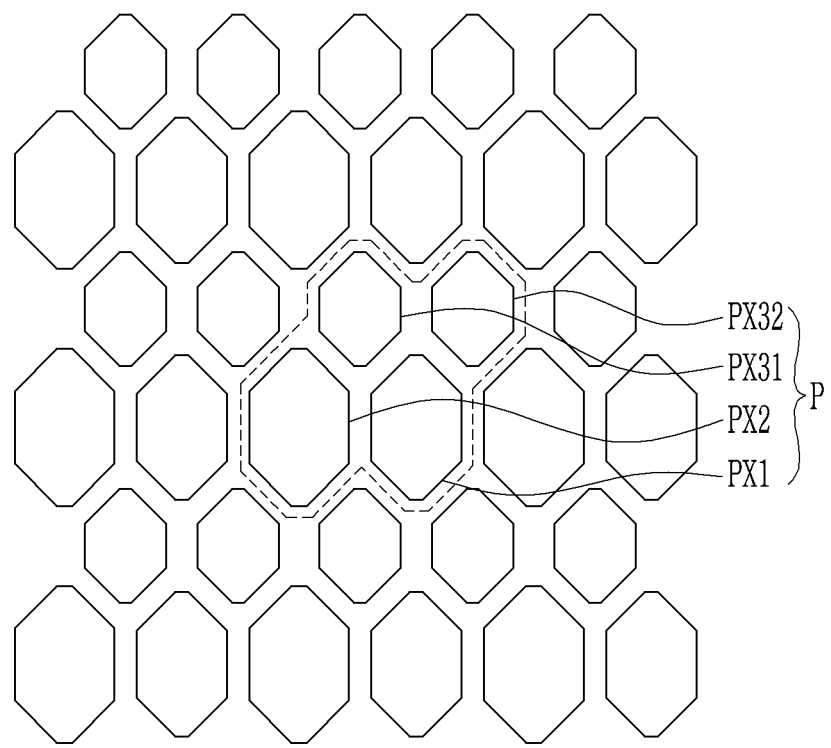
FIG. 10 illustrates a layout view of a plurality of pixels of a display device according to an embodiment.

Hereinafter, a pixel arrangement of a display device according to another embodiment will be described with reference to FIG. 10. FIG. 10 illustrates a layout view of a plurality of pixels of a display device according to an embodiment.

Referring to FIG. 10, the pixel arrangement of the display device according to the present embodiment is similar to that of the display device according to the embodiment shown in FIG. 1.

However, in the pixel arrangement of the display device according to the present embodiment, the number of the plurality of third pixels disposed along the first direction DR1 may be approximately twice the number of the plurality of third pixels PX3 of FIG. 1.

One dot P includes a first pixel PX1, a second pixel PX2, a third pixel PX31, and a fourth pixel PX32. The third pixel PX31 and the fourth pixel PX32 may be pixels that display the same color or may be pixels that display different colors. For example, in one embodiment, both the third pixel PX31 and the fourth pixel PX32 may be blue pixels. In another embodiment, the third pixel PX31 may be a blue pixel and the fourth pixel PX32 may be a white pixel.

The first pixel PX1, the second pixel PX2, the third pixel PX31, and the fourth pixel PX32 may all have a polygonal shape with an aspect ratio of greater than 1, such as the pixel of the display device according to the embodiment shown in FIG. 1, and for example, they may have an octagonal shape.

Although not shown, the planar shapes of the color filter area and the light emitting area may be the same as or different from the planar shape of the color conversion area.

Many features of the display device according to the above-described embodiments are applicable to the display device according to the present embodiment.

While this inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a first pixel, a second pixel, and a third pixel that form one dot and display different colors;
a first light emitting element disposed in the first pixel, a second light emitting element disposed in the second pixel, and a third light emitting element disposed in the third pixel; and
a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed,
wherein the first color conversion area, the second color conversion area, and the third color conversion area have polygonal planar shapes having at least 5 sides, and
wherein a first length which is a distance between edges facing each other in a first direction in the first color conversion area, a second length which is a distance between edges facing each other in a second direction in the first color conversion area are different from each other;
wherein the first pixel and the second pixel are disposed in a first row and disposed adjacent to each other along a horizontal direction, the third pixel and the first pixel are alternately disposed along a vertical direction, the third pixel and the second pixel are alternately disposed along the vertical direction, and an imaginary line connecting a center of the first pixel, a center of the second pixel, and a center of the third pixel forms a triangular planar shape.

2. The display device of claim 1, wherein a horizontal length of a planar area of the dot is larger than a sum of a first horizontal width of the first color conversion area of the first pixel and a second horizontal width of the second color conversion area of the second pixel, a vertical length of a planar area of the dot is smaller than a sum of a first vertical width of the first color conversion area of the first pixel and a third vertical width of a third color conversion area of the third pixel, and a vertical length of a planar area of the dot is smaller than a sum of a second vertical width of the second color conversion area of the second pixel and a third vertical width of a third color conversion area of the third pixel.

3. The display device of claim 2, wherein the polygonal planar shape has eight sides.

4. The display device of claim 3, further comprising a first color filter area in which the first light emitting element and a first color filter overlapping the first color conversion layer are disposed, a second color filter area in which the second light emitting element and a second color filter overlapping the second color conversion layer are disposed, and a third color filter area in which the third light emitting element and a third color filter overlapping the third color conversion layer are disposed,
wherein:
a planar area of the first color filter area is wider than that of a first light emitting area of the first light emitting element, and a planar area of the first color conversion area is wider than that of the first color filter area;
a planar area of the second color filter area is wider than that of a second light emitting area of the second light emitting element, and a planar area of the second color conversion area is wider than that of the second color filter area; and
a planar area of the third color filter area is wider than that of a third light emitting area of the third light emitting element, and a planar area of the third color conversion area is wider than that of the third color filter area.

5. The display device of claim 3, wherein a light emitting layer of each of the first light emitting element, the second light emitting element and the third light emitting element emits light of a first wavelength, the first color conversion layer converts the light of the first wavelength to light of a second wavelength, the second color conversion layer converts the light of the first wavelength to light of a third wavelength, and the third color conversion layer transmits the light of the first wavelength.

6. The display device of claim 5, wherein the first color conversion layer includes first quantum dots and scatterers, the second color conversion layer includes second quantum dots and the scatterers, and the third color conversion layer includes the scatterers.

7. The display device of claim 3, further comprising a first substrate and a second substrate facing each other,
wherein:
the first light emitting element, the second light emitting element, and the third light emitting element are disposed between the first substrate and the second substrate;
the first color conversion layer, the second color conversion layer, and the third color conversion layer are disposed between the second substrate and the first light emitting element, the second light emitting element, and the third light emitting element, respectively, and the first color conversion area, the second color conversion area, and the third color conversion area are defined by partition walls.

8. The display device of claim 7, further comprising a cover layer disposed on a side surface of the partition walls and on a lower surface of the partition walls facing the first substrate, and a spacer protruding from a portion of the cover layer toward the first substrate.

9. The display device of claim 1, wherein:
the dot further includes a fourth pixel;
the fourth pixel and the first pixel are alternately disposed along the vertical direction.

10. A display device comprising:
a first pixel, a second pixel, and a third pixel that form one dot and display different colors;
a first light emitting element disposed in the first pixel, a second light emitting element disposed in the second pixel, and a third light emitting element disposed in the third pixel; and
a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed,
wherein:
the first color conversion area, the second color conversion area, and the third color conversion area have polygonal planar shapes with an aspect ratio of greater than 1;
a horizontal length of a planar area of the dot is smaller than a sum of a first horizontal width of the first color conversion area of the first pixel and a third horizontal width of the third color conversion area of the third pixel;
a horizontal length of a planar area of the dot is smaller than a sum of a second width of the second color conversion area of the second pixel and a third horizontal width of the third color conversion area of the third pixel;
a vertical length of a planar area of the dot is larger than a sum of a first vertical width of the first color conversion area of the first pixel and a second vertical width of the second color conversion area of the second pixel;
the first pixel and the second pixel are disposed in a line to be adjacent to each other along a vertical direction;
the third pixel and the first pixel are alternately disposed along a horizontal direction;
the third pixel and the second pixel are alternately disposed along the horizontal direction; and
an imaginary line connecting a center of the first pixel, a center of the second pixel, and a center of the third pixel forms a triangular planar shape, and
wherein a first length which is a distance between edges facing each other in a first direction in the first color conversion area, a second length which is a distance between edges facing each other in a second direction in the first color conversion area are different from each other.

11. A display device comprising:
a first pixel, a second pixel, and a third pixel that form one dot and display different colors;
a first light emitting element disposed in the first pixel, a second light emitting element disposed in the second pixel, and a third light emitting element disposed in the third pixel; and
a first color conversion area in which a first color conversion layer overlapping the first light emitting element is disposed, a second color conversion area in which a second color conversion layer overlapping the second light emitting element is disposed, and a third color conversion area in which a third color conversion layer overlapping the third light emitting element is disposed,
wherein a horizontal length of a planar area of the dot is larger than a sum of a first horizontal width of the first color conversion area of the first pixel and a second horizontal width of the second color conversion area of the second pixel, a vertical length of a planar area of the dot is smaller than a sum of a first vertical width of the first color conversion area of the first pixel and a third vertical width of a third color conversion area of the third pixel, and a vertical length of a planar area of the dot is smaller than a sum of a second vertical width of the second color conversion area of the second pixel and a third vertical width of a third color conversion area of the third pixel, and
wherein a first length which is a distance between edges facing each other in a first direction in the first color conversion area, a second length which is a distance between edges facing each other in a second direction in the first color conversion area are different from each other;
wherein the first pixel and the second pixel are disposed in a first row and disposed adjacent to each other along a horizontal direction, the third pixel and the first pixel are alternately disposed along a vertical direction, the third pixel and the second pixel are alternately disposed along the vertical direction, and an imaginary line connecting a center of the first pixel, a center of the second pixel, and a center of the third pixel forms a triangular planar shape.

12. The display device of claim 11, wherein the first color conversion area, the second color conversion area, and the third color conversion area have polygonal planar shapes having at least five sides.

13. The display device of claim 11, further comprising a first color filter area in which a first pixel electrode and a first color filter overlapping the first color conversion layer are disposed, a second color filter area in which a second pixel electrode and a second color filter overlapping the second color conversion layer are disposed, and a third color filter area in which a third pixel electrode and a third color filter overlapping the third color conversion layer are disposed,
wherein:
a planar area of the first color filter area is wider than that of a first light emitting area of the first light emitting element, and a planar area of the first color conversion area is wider than that of the first color filter area;
a planar area of the second color filter area is wider than that of a second light emitting area of the second light emitting element, and a planar area of the second color conversion area is wider than that of the second color filter area; and
a planar area of the third color filter area is wider than that of a third light emitting area of the third light emitting element, and a planar area of the third color conversion area is wider than that of the third color filter area.

14. The display device of claim 11, wherein a light emitting layer of each of the first light emitting element, the second light emitting element and the third light emitting element emits light of a first wavelength, the first color conversion layer converts the light of the first wavelength to light of a second wavelength, the second color conversion layer converts the light of the first wavelength to light of a third wavelength, and the third color conversion layer transmits the light of the first wavelength.

15. The display device of claim 14, wherein the first color conversion layer includes first quantum dots and scatterers, the second color conversion layer includes second quantum dots and the scatterers, and the third color conversion layer includes the scatterers.

16. The display device of claim 11, further comprising a first substrate and a second substrate facing each other, wherein:
the first light emitting element, the second light emitting element, and the third light emitting element are disposed between the first substrate and the second substrate;
the first color conversion layer, the second color conversion layer, and the third color conversion layer are disposed between the second substrate and the first light emitting element, the second light emitting element, and the third light emitting element; and
the first color conversion area, the second color conversion area, and the third color conversion area are defined by partition walls.

17. The display device of claim 16, further comprising:
a cover layer disposed on a side surface of the partition walls and on a lower surface of the partition walls facing the first substrate; and
a spacer protruding from a portion of the cover layer toward the first substrate.

18. The display device of claim 11, wherein the dot further includes a fourth pixel, the fourth pixel and the first pixel are alternately disposed along the vertical direction.

* * * * *